(12) United States Patent
Sato et al.

(10) Patent No.: US 10,508,801 B2
(45) Date of Patent: Dec. 17, 2019

(54) WAVELENGTH CONVERSION MEMBER AND LIGHT-EMITTING DEVICE

(71) Applicant: NGK SPARK PLUG CO., LTD., Nagoya-shi, Aichi (JP)

(72) Inventors: Yumi Sato, Sendai (JP); Yoshifumi Tsutai, Tomiya (JP); Takashi Abe, Tomiya (JP); Yutaka Sato, Funabashi (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 16/070,974

(22) PCT Filed: Jan. 13, 2017

(86) PCT No.: PCT/JP2017/001078
§ 371 (c)(1),
(2) Date: Jul. 18, 2018

(87) PCT Pub. No.: WO2017/126441
PCT Pub. Date: Jul. 27, 2017

(65) Prior Publication Data
US 2019/0024879 A1    Jan. 24, 2019

(30) Foreign Application Priority Data

Jan. 22, 2016  (JP) ................................ 2016-011100

(51) Int. Cl.
| | | |
|---|---|---|
| F21V 29/10 | (2015.01) | |
| F21V 7/30 | (2018.01) | |
| F21V 9/35 | (2018.01) | |
| C09K 11/02 | (2006.01) | |
| C09K 11/77 | (2006.01) | |
| F21Y 115/30 | (2016.01) | |
| F21Y 115/10 | (2016.01) | |

(52) U.S. Cl.
CPC ............. *F21V 29/10* (2015.01); *C09K 11/02* (2013.01); *C09K 11/7706* (2013.01); *F21V 7/30* (2018.02);
(Continued)

(58) Field of Classification Search
CPC ... F21V 29/10; F21V 7/30; F21V 9/35; C09K 11/02; C09K 11/7706
See application file for complete search history.

(56) References Cited

U.S. PATENT DOCUMENTS

| | | |
|---|---|---|
| 2013/0257264 A1 | 10/2013 | Tamaki et al. |
| 2015/0159836 A1 | 6/2015 | Tamaki et al. |
| 2015/0204494 A1 | 7/2015 | Wada et al. |

FOREIGN PATENT DOCUMENTS

| | | |
|---|---|---|
| CN | 103367611 A | 10/2013 |
| EP | 2581943 A1 | 4/2013 |

(Continued)

OTHER PUBLICATIONS

Japan Patent Office, International Search Report issued in International Phase of this Application (PCT/JP2017/001078), dated Jun. 13, 2017.

(Continued)

*Primary Examiner* — Joseph L Williams
(74) *Attorney, Agent, or Firm* — Stites & Harbison, PLLC; Jeffrey A. Haeberlin

(57) ABSTRACT

The invention provides a fluorescent member which has high thermal conductivity and thus can prevent an increase in temperature of a phosphor layer and can maintain fluorescent performance even when irradiated with source light having a high intensity, and provides a light-emitting device having such a member. A reflection-type wavelength converting member 100 converts light with a specific wavelength to light with other wavelength and also reflects the light on a reflection surface to emit the light as illumination light. The wavelength converting member 100 includes a substrate 110 including an inorganic material, and a phosphor layer 120 disposed on the substrate 110 and including phosphor particles 122 that absorb light and emit converted light and a translucent ceramic 121 that binds the phosphor (Continued)

particles 122 to one another. The ratio of the thickness of the phosphor layer 120 to the average particle size of the phosphor particles 122 is less than 30. The reflection surface on which the converted light is reflected is a surface of the substrate 110 or a surface of a reflector adjacent to the wavelength converting member.

8 Claims, 8 Drawing Sheets

(52) U.S. Cl.
CPC .............. *F21V 9/35* (2018.02); *F21Y 2115/10* (2016.08); *F21Y 2115/30* (2016.08)

(56) References Cited

FOREIGN PATENT DOCUMENTS

| | | |
|---|---|---|
| EP | 2752897 A1 | 7/2014 |
| JP | 2012-185403 A | 9/2012 |
| JP | 2013-247067 A | 12/2013 |
| JP | 2014-241431 A | 12/2014 |
| JP | 2015-038960 A | 2/2015 |
| JP | 2015-065425 A | 4/2015 |
| JP | 2015-090887 A | 5/2015 |
| JP | 2015-094777 A | 5/2015 |
| JP | 2015-119172 A | 6/2015 |
| JP | 2015-138839 A | 7/2015 |
| TW | 2015-01367 A | 1/2015 |

OTHER PUBLICATIONS

Japan Patent Office, Written Opinion issued in International Phase of this Application (PCT/JP2017/001078), dated Jun. 13, 2017. (English translation not available.).

Taiwan Intellectual Property Office, Office Action issued in corresponding Application No. 106102006, dated Dec. 11, 2017. (English translation not available.).

European Patent Office, Extended European Search Report (EESR) issued in corresponding Application No. 17741319.2 dated Sep. 9, 2019.

(a)

(b)

(c)

(a)

(b)

(a)

(b)

WAVELENGTH CONVERSION MEMBER AND LIGHT-EMITTING DEVICE

TECHNICAL FIELD

The present invention relates to a wavelength converting member of reflection type that converts light with a specific wavelength to light with other wavelength and also reflects the light on a reflection surface to emit the light as illumination light, and to a light-emitting device.

BACKGROUND ART

Light-emitting elements are known in which, for example, a wavelength converting member in which phosphor particles are dispersed in a resin such as epoxy or silicone is disposed in contact with a blue LED element. In recent applications, LEDs are increasingly replaced by laser diodes (LDs) which have a high energy efficiency and are easily adaptable to miniaturization and increase in output.

Lasers apply high-energy light to a local site. When laser light is focused onto a resin, the irradiated site is burnt. To this problem, an approach has been presented in which a ring-shaped wavelength converting member is irradiated with laser light while being rotated at a high speed to prevent burning (Patent Literature 1).

The above approach leads to an increase in size and complication of tools and apparatuses, causing the system to undergo significant limitation. Further, use has been proposed of all-inorganic wavelength converting members that contain an inorganic binder in place of a resin (Patent Literatures 2 to 7).

CITATION LIST

Patent Literature

PTL 1: Japanese Unexamined Patent Application Publication No. 2015-94777
PTL 2: Japanese Unexamined Patent Application Publication No. 2015-90887
PTL 3: Japanese Unexamined Patent Application Publication No. 2015-38960
PTL 4: Japanese Unexamined Patent Application Publication No. 2015-65425
PTL 5: Japanese Unexamined Patent Application Publication No. 2014-241431
PTL 6: Japanese Unexamined Patent Application Publication No. 2015-119172
PTL 7: Japanese Unexamined Patent Application Publication No. 2015-138839

SUMMARY OF INVENTION

Technical Problem

Such wavelength converting members described above that use an inorganic binder attain enhanced heat resistance of the material itself. If, however, phosphor particles generate heat by being excited by laser power and an increased amount of heat is stored, the phosphor particles sometime lose the luminescent performance. Thus, in practice, such wavelength converting members are hardly usable in a high-energy environment.

The present invention has been made in light of the circumstances described above. Objects of the invention are therefore to provide a wavelength converting member which has low thermal resistance and thus can prevent an increase in temperature of a phosphor layer and can maintain fluorescent performance even when irradiated with source light having a high intensity, and to provide a light-emitting device having such a wavelength converting member.

Solution to Problem (1) To achieve the above objects, a wavelength converting member of the present invention is of reflection type configured to convert light with a specific wavelength to light with other wavelength and also configured to reflect the light on a reflection surface, thereby emitting the light as illumination light, wherein the wavelength converting member includes a substrate including an inorganic material, and a phosphor layer disposed on the substrate and including phosphor particles that absorb light and emit converted light and a translucent ceramic that binds the phosphor particles to one another, wherein the ratio of the thickness of the phosphor layer to the average particle size of the phosphor particles is less than 30, wherein when the wavelength converting member is irradiated with source light having a specific wavelength at a power density of 20 $W/mm^2$, the emission efficiency retention ratio of the phosphor layer is not less than 70%, and wherein the reflection surface on which the converted light is reflected is a surface of the substrate or a surface of a reflector adjacent to the wavelength converting member. With this configuration, the thermal resistance is reduced and the phosphor layer can be prevented from an increase in temperature and can maintain the fluorescent performance even when irradiated with source light having a high intensity. Further, the above wavelength converting member can constitute a light-emitting device that does not decrease fluorescent performance even when continuing to emit light at a high output.

(2) Further, the wavelength converting member of the invention satisfies the following conditions. (a) When the average particle size of the phosphor particles is less than 1 µm, the ratio of the thickness of the phosphor layer to the average particle size of the phosphor particles is less than 30. (b) When the average particle size of the phosphor particles is not less than 1 µm and less than 5 µm, the ratio of the thickness of the phosphor layer to the average particle size of the phosphor particles is less than 15. (c) When the average particle size of the phosphor particles is not less than 5 µm and less than 10 µm, the ratio of the thickness of the phosphor layer to the average particle size of the phosphor particles is less than 10. (d) When the average particle size of the phosphor particles is not less than 10 µm, the ratio of the thickness of the phosphor layer to the average particle size of the phosphor particles is less than 5.

In the above manner, the wavelength converting member, when used as a reflection type, can attain a reduction in thermal resistance at grain boundaries by virtue of the number density of particles in the phosphor layer being controlled not to be excessively high, and can emit homogenous light by virtue of the structure inside the phosphor layer being rendered homogeneous. The term "homogeneous light" in the present invention means that the value of a local spectrum peak of absorbed light (excitation light) is less than 2 times the average value of spectrum peaks of absorbed light (excitation light) in the plane as measured with a two-dimensional color analyzer (CA-2500 manufactured by KONICA MINOLTA JAPAN, INC.).

(3) In the wavelength converting member of the present invention, the porosity of the phosphor layer is 30 to 70% wherein the porosity is the proportion of the volume of pores calculated by subtracting the volume of solid components present in an apparent volume from the apparent volume wherein the apparent volume is the volume of a layer with a constant thickness defined between planes of the phosphor layer in contact with the outermost surface of the phosphor particles and with the substrate. With this configuration, the phosphor layer contains a large number of holes dispersed therein, and the light applied to the layer is diffused (diffusely reflected) inside the phosphor layer to facilitate the irradiation of the phosphor particles with the light.

(4) In the wavelength converting member of the present invention, the substrate includes aluminum. With this configuration, high thermal conductivity can be ensured and the temperature increase in the phosphor layer can be reduced.

(5) A light-emitting device of the present invention includes a light source which generates source light having a specific wavelength, and the wavelength converting member described in any of (1) to (4) which absorbs the source light and emits light with other wavelength converted from the source light. The light-emitting device having this configuration can maintain fluorescent performance even when irradiated with source light having a high intensity.

Advantageous Effects of Invention

The present invention can realize low thermal resistance and can prevent an increase in temperature of a phosphor layer to allow the phosphor layer to maintain fluorescent performance even when irradiated with source light having a high intensity.

DESCRIPTION OF EMBODIMENTS

Figure 1:
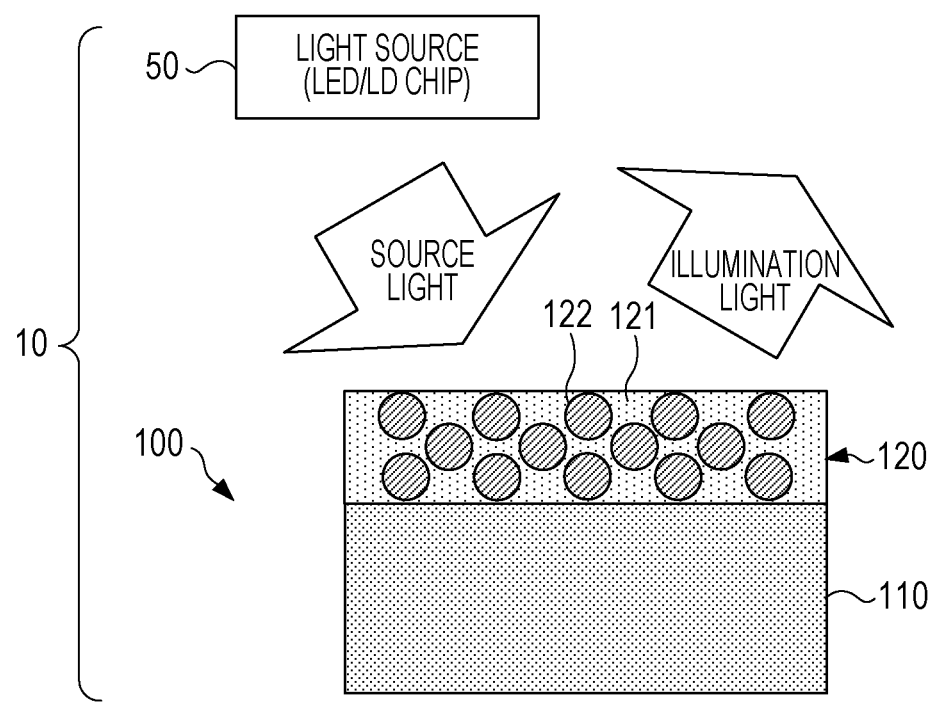
FIG. 1 is a schematic view of a light-emitting device according to the present invention.

Next, embodiments of the present invention will be described with reference to the drawings. To facilitate the understanding of the description, the same reference numerals will be used for equivalent features in the drawings, and overlaps in the description will be omitted. In the drawings, the size of the features is only illustrative and is not to actual scale.

[Configurations of Reflection-Type Light-Emitting Devices]

FIG. 1 is a schematic view of a reflection-type light-emitting device 10. As illustrated in FIG. 1, the light-emitting device 10 includes a light source 50 and a wavelength converting member 100 and is configured so that, for example, source light reflected by the wavelength converting member 100 and light generated within the wavelength converting member 100 by excitation with the source light are combined and emitted as illumination light. The illumination light may be, for example, white light.

The light source 50 may be a chip of an LED (light-emitting diode) or an LD (laser diode). An LED generates source light having a specific range of wavelength in accordance with the design of the light-emitting device 10. For example, the LED generates blue light. When an LD is used, coherent light having little variations in wavelength and phase can be generated. The light source 50 is not limited to those described above and may be a light source that emits light other than visible lights. A preferred light source is one that generates ultraviolet light, blue light or green light. A blue light source is particularly preferable.

[Configurations of Reflection-Type Wavelength Converting Members]

The wavelength converting member 100 includes a substrate 110 and a phosphor layer 120, and is sheet-shaped and is configured to reflect source light on the substrate 110 and to be excited by the source light so as to generate light with a different wavelength. For example, the wavelength converting member can emit white light by reflecting blue light and generating green and red or yellow fluorescences. The substrate 110 is sheet-shaped and may be made of, for example, an inorganic material capable of reflecting source light. Preferably, the substrate 110 includes aluminum. Adopting such a substrate 110 with high thermal conductivity can reduce the storage of heat in the phosphor layer 120, can suppress the temperature increase of phosphor particles, and can prevent thermal quenching.

The phosphor layer 120 is provided in the form of a film on the substrate 110, and is formed from phosphor particles 122 and a translucent ceramic 121. The translucent ceramic 121 binds the phosphor particles 122 to one another and also binds the substrate 110 and the phosphor particles 122. The thickness of the phosphor layer 120 is small relative to the phosphor particle size, and thus the heat generated in the phosphor layer 120 can be conducted to the substrate 110 efficiently and the temperature increase in the phosphor layer 120 can be prevented. As a result, the phosphor layer can maintain fluorescent performance even when irradiated with source light having a high intensity.

That is, the phosphor layer 120 is formed with as small a thickness as possible, as long as the desired color design is feasible. This configuration makes it possible to suppress thermal quenching by the generation of heat (the storage of heat) of the phosphor particles 122 even in the case where the source light is laser light having a high energy density. To further increase the reflectance, it is preferable that an Ag film be disposed on the surface of the substrate. In light of thermal conductivity, the thickness of the wavelength converting member 100 is preferably as described in the table below.

Thermal resistance, which indicates how much a material resists thermal transfer, is dependent on thickness when the thermal resistivity or thermal conductivity and the area of the phosphor layer are constant, and increases with increasing thickness. During the application of laser light, heat is conducted more easily and is less likely to be stored, and consequently thermal quenching due to heat generation (heat storage) can be suppressed more effectively as thermal resistance is lower, that is, as the thickness is smaller.

TABLE 1

| Average particle size (μm) | | Film thickness/Particle size | |
|---|---|---|---|
| Not less than | Less than | Not less than | Less than |
| — | 1 | — | 30 |
| 1 | 5 | — | 15 |
| 5 | 10 | — | 10 |
| 10 | — | — | 5 |

The translucent ceramic 121 is an inorganic binder that serves to hold the phosphor particles 122 together, and includes, for example, silica ($SiO_2$) or aluminum phosphate. For example, the phosphor particles 122 may be an yttrium/aluminum/garnet-based phosphor (YAG-based phosphor) and a lutetium/aluminum/garnet-based phosphor (LAG-based phosphor).

Further, phosphor particles of the following materials may be selected in accordance with the design of a color to be emitted. Examples of such phosphors include blue phosphors such as $BaMgAl_{10}O_{17}$:Eu, ZnS:Ag, Cl, $BaAl_2S_4$:Eu and $CaMgSi_2O_6$:Eu, yellow or green phosphors such as $Zn_2SiO_4$:Mn, (Y,Gd)$BO_3$:Tb, ZnS:Cu, Al, (M1)$_2SiO_4$:Eu, (M1) (M2)$_2$S:Eu, (M3)$_3Al_5O_{12}$:Ce, SiAlON:Eu, CaSiAlON:Eu, (M1)$Si_2O_2N$:Eu and (Ba,Sr,Mg)$_2SiO_4$:Eu, Mn, yellow, orange or red phosphors such as (M1)$_3SiO_5$:Eu and (M1)S:Eu, and red phosphors such as (Y,Gd)$BO_3$:Eu, $Y_2O_2S$:Eu, (M1)$_2Si_5N_8$:Eu, (M1)$AlSiN_3$:Eu and $YPVO_4$:Eu. In these formulae, M1 includes at least one selected from the group consisting of Ba, Ca, Sr and Mg, M2 includes at least one of Ga and Al, and M3 includes at least one selected from the group consisting of Y, Gd, Lu and Te. The phosphor particles described above are only examples, and the phosphor particles used in the wavelength converting member are not necessarily limited to those mentioned above.

The porosity of the phosphor layer 120 is preferably not less than 30% and not more than 70%. Because such a large number of holes are present in the inside of the phosphor layer 120, the source light is diffused inside the layer and efficiently illuminates the phosphor particles 122 in spite of the small thickness of the phosphor layer 120.

The thickness of the phosphor layer 120 is preferably determined in relation to the average particle size of the phosphor particles 122 so that the ratio of the thickness of the phosphor layer to the average particle size of the phosphor particles falls in a predetermined range. The film thickness is less than a predetermined multiple of the particle size of the phosphor particles, and consequently the number density of the particles inside the phosphor layer 120 is not excessively high and the thermal resistance at grain boundaries can be reduced. At the same time, the film thickness is not less than a predetermined multiple of the particle size of the phosphor particles, and consequently the inside structure of the phosphor layer 120 can be rendered homogeneous and the phosphor layer 120 can ensure strength and can emit homogeneous light.

By the configurations described above, the wavelength converting member 100, when irradiated with source light at a power density of 20 W/mm$^2$, preferably has an emission efficiency retention ratio of not less than 70%. The satisfaction of this requirement allows the member to constitute a light-emitting device 10 that does not reduce fluorescent performance even when caused to emit light at a high output. Such a light-emitting device 10 is expected to provide high effects when applied to, for example, illumination of factories and public facilities such as stadiums and art museums, or automobile headlight lamps.

[Methods for Fabricating Wavelength Converting Members]

Figure 2:
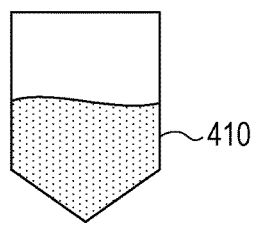
FIGS. 2(a), 2(b) and 2(c) are each a sectional view illustrating a step in the fabrication of a wavelength converting member of the present invention.
Figure 2:
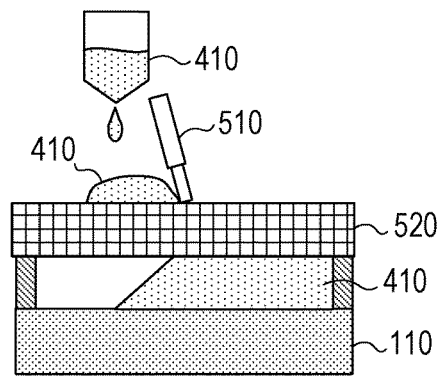
Figure 2:
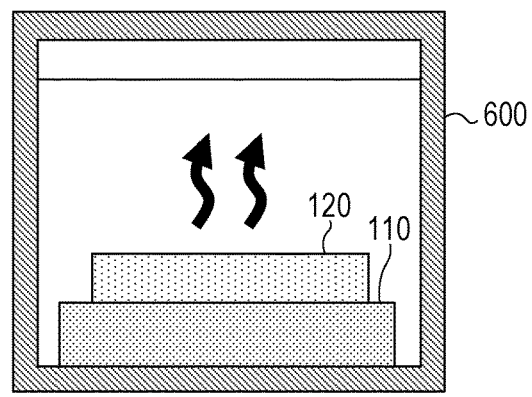

FIGS. 2(a), 2(b) and 2(c) are each a sectional view illustrating a step in the fabrication of a wavelength converting member of the present invention. First, an inorganic binder, a solvent and phosphor particles are provided. For example, a preferred inorganic binder may be ethyl silicate obtained by dissolving a silicon precursor into ethanol.

Alternatively, the inorganic binder may be one obtained by reacting at room temperature or heat treating at a temperature of not more than 500° C. a raw material including at least one selected from the group consisting of silicon oxide precursors which form silicon oxide by hydrolysis or oxidation, silicic acid compounds, silica and amorphous silica. Examples of the silicon oxide precursors include those based on perhydropolysilazane, ethyl silicate or methyl silicate.

The solvent may be a high-boiling solvent such as butanol, isophorone, terpineol or glycerol. For example, the phosphor particles may be particles of YAG, LAG and the like. The types and amounts of the phosphor particles are controlled depending on the target illumination light in association with the source light. When, for example, white light is to be obtained from blue light, appropriate amounts of particles of phosphors that are excited by blue light to emit green light and red or yellow light are selected.

As illustrated in FIG. 2(a), the inorganic binder, the solvent and the phosphor particles are mixed with each other to give a paste (an ink) 410. The mixing may be performed with a device such as a ball mill. Separately, a substrate made of an inorganic material is provided. The substrate may be aluminum. The substrate is preferably in the form of a sheet. A transmission-type wavelength converting member may be fabricated by using such a substrate as glass, sapphire or the like.

Next, as illustrated in FIG. 2(b), the paste 410 is applied onto the substrate 110 by a screen printing method so that the film thickness will have a ratio to the average particle size in the range described in the table hereinabove. The screen printing may be performed by squeezing the paste 410 through a framed silk screen 520 with use of an ink squeegee 510. Besides screen printing, the paste may be applied by spraying, dispenser drawing or inkjetting. A screen printing method is preferable in order to form a thin phosphor layer stably.

The printed paste 410 is then dried and is heat treated in a furnace 600 to evaporate the solvent as well as to drive off the organic matter in the inorganic binder and to oxidize the predominant metal in the inorganic binder (when the predominant metal is Si, to convert the metal into $SiO_2$) while performing bonding of the phosphor layer 120 with the substrate 110. A wavelength converting member can be thus obtained.

A light-emitting device may be fabricated by appropriately arranging a wavelength converting member which has a substrate suited for reflection, with respect to a light source such as an LED.

EXAMPLES (1. Examination of Quenching Depending on Types of Substrates)
(1-1) Sample Fabrication Method First, wavelength converting members were fabricated as described below. A paste prepared by mixing ethyl silicate and terpineol with YAG phosphor particles (average particle size 18 μm) was applied to sheets made of glass, sapphire and aluminum as substrates by a screen printing method so that the film thickness would be 40 μm, and the wet films were heat treated. Sample wavelength converting members were thus obtained.

(1-2) Evaluation Method

Figure 3:
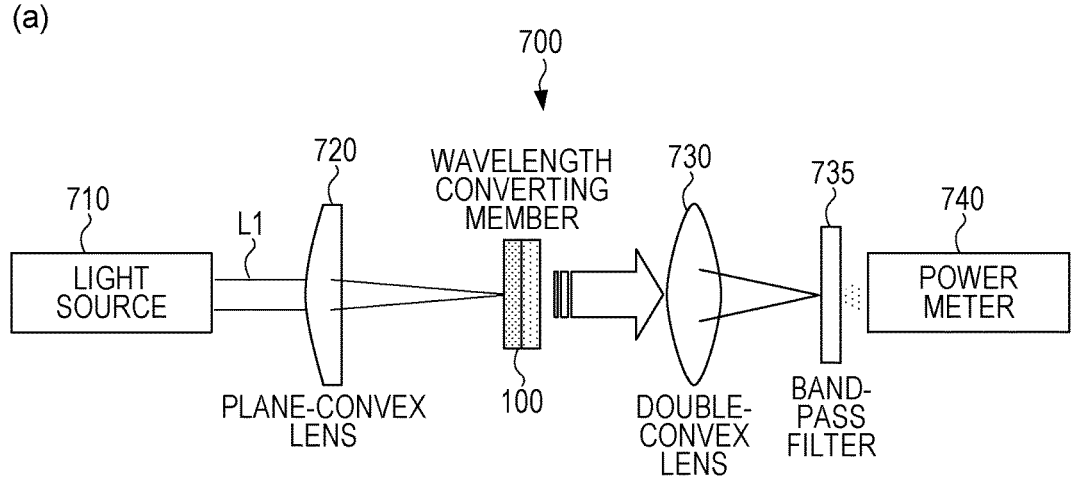
FIGS. 3(a) and 3(b) are sectional views illustrating transmission-type and reflection-type systems, respectively, for evaluating a wavelength converting member.
Figure 3:
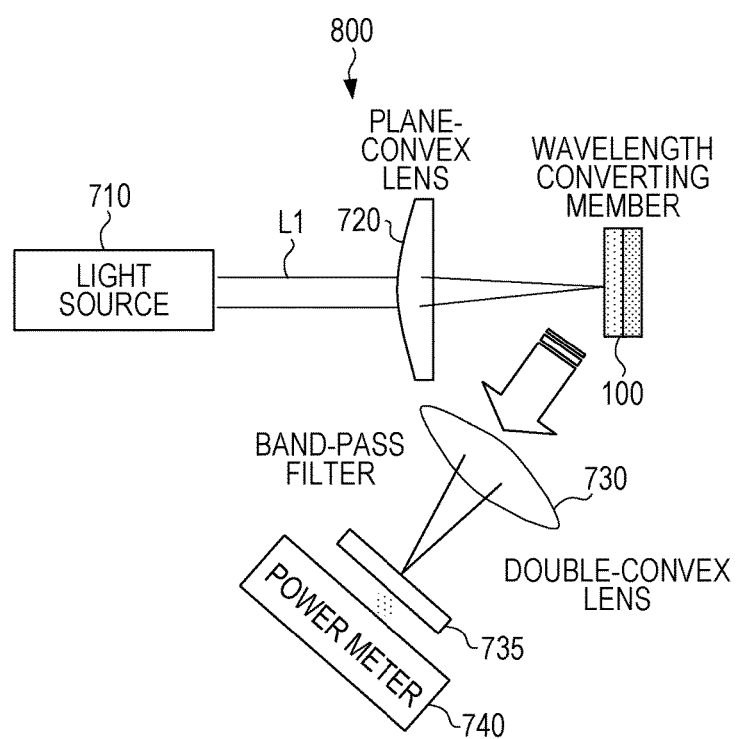

The wavelength converting members obtained by the above fabrication method were irradiated with laser light to examine the fluorescent emission intensity and the emission efficiency retention ratio at various laser input values. FIGS. 3(a) and 3(b) are sectional views illustrating transmission-type and reflection-type evaluation systems 700 and 800, respectively, for the evaluation of wavelength converting members. As illustrated in FIG. 3(a), the transmission-type evaluation system 700 is composed of a light source 710, a plane-convex lens 720, a double-convex lens 730, a band-pass filter 735 and a power meter 740. The band-pass filter 735 is a filter that blocks light with wavelengths of 480 nm and below, and is disposed between the double-convex lens and the power meter in the measurement of the fluorescent emission intensity in order to screen out the source light (excitation light) that has passed through the sample, from the fluorescent light.

The source light that has entered into the plane-convex lens 720 is condensed to a focus on the wavelength converting member 100. The radiation emitted from the wavelength converting member 100 is gathered by the double-convex lens 730, and the gathered light is filtered to screen out components with wavelengths of 480 nm and less, and the intensity of the remainder light is measured with the power meter 740. The value measured is the fluorescent emission intensity. On the other hand, as illustrated in FIG. 3(b), the reflection-type evaluation system 800 includes the same features as the evaluation system 700 except that the features are arranged so that light reflected from the wavelength converting member 100 can be gathered and measured. By condensing the laser light with the lens to focus on a narrow irradiation area, the energy density per unit area can be increased even with a low-output laser. This energy density is the laser power density.

The wavelength converting members were evaluated using the above two types of evaluation systems 700 and 800 appropriately. The transmission-type evaluation system 700 was used for those samples having a glass or sapphire substrate, and the reflection-type evaluation system 800 was used for those samples having an aluminum substrate. The fluorescent emission intensity is the relative intensity obtained by converting to dimensionless the value shown on a luminance meter during the measurement with the above evaluation system. The emission efficiency retention ratio is the ratio of the emission efficiency at a given laser power density to the emission efficiency at a low laser power density where the influence of heat generation and heat storage is negligible, taken as 100%.

(1-3) Evaluation Results

Figure 4:
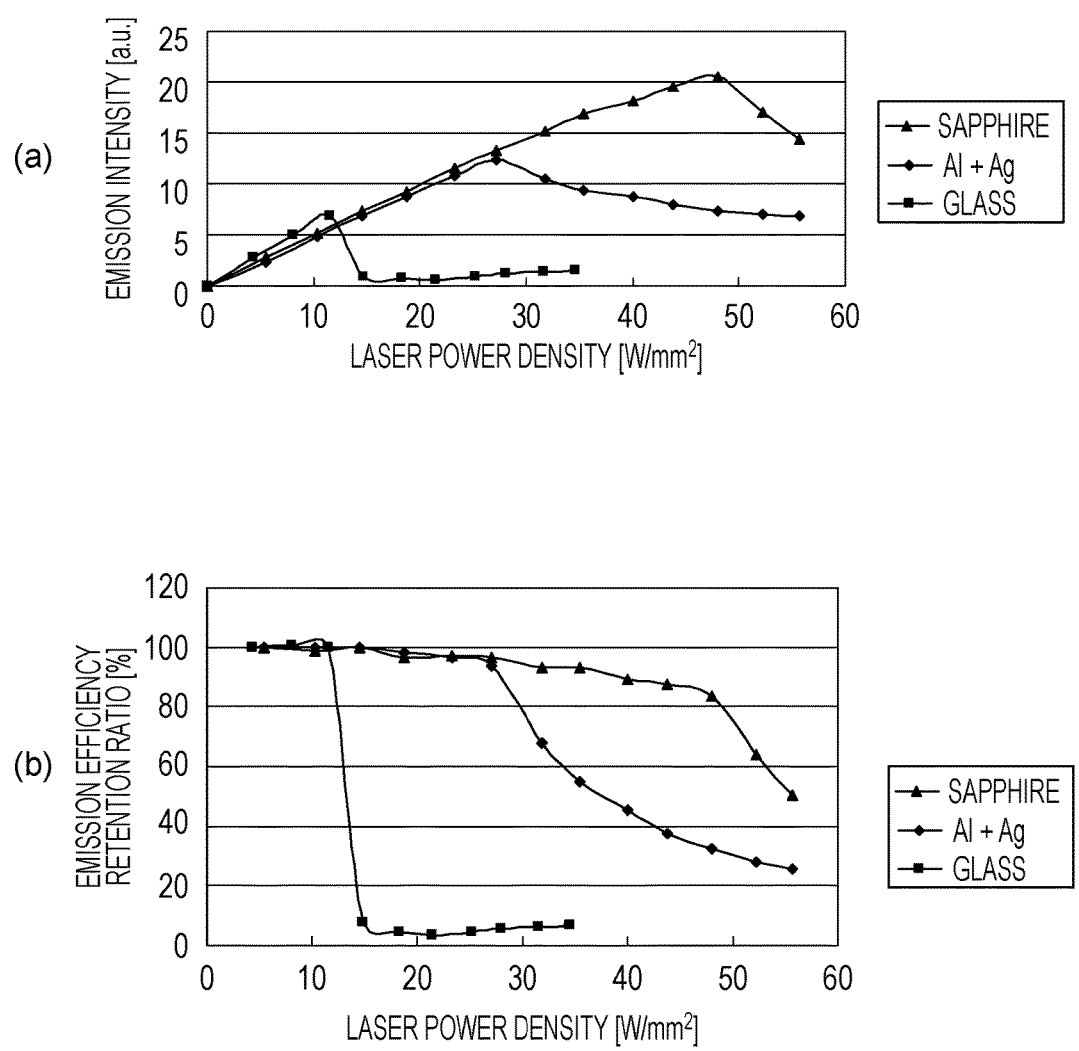
FIGS. 4(a) and 4(b) are each a graph illustrating emission characteristics obtained while changing substrates.

By the above evaluation, the emission characteristics depending on the types of substrates were obtained. FIGS. 4(a) and 4(b) are each a graph illustrating the emission characteristics obtained while changing the substrates. It has been shown that the fluorescent emission intensity is increased substantially proportionally with the increase in power density up to a certain laser power density with the 3 types of substrates. The emission decreased at laser power densities of 48 W/mm² and above for the sapphire substrate, at laser power densities of 27 W/mm² and above for the aluminum substrate, and at laser power densities of 11 W/mm² and above for the glass substrate.

Phosphor particles are thermally quenched by an increase in temperature and decrease their luminescent performance. Aluminum has higher thermal conductivity than glass. Thus, the reason for the above results is probably because the aluminum substrate prevented the heat generated by the phosphor particles from being stored in the wavelength converting member and consequently the quenching of the phosphor was suppressed.

According to the above results, quenching was suppressed to a greater degree by the sapphire substrate than by the aluminum substrate having high thermal conductivity. The reason for this is probably because in the measurement of the transmissive sapphire substrate, the laser light was applied through the substrate and the heat stored in the phosphor was quickly released to the substrate.

(2. Examination of Thermal Quenching Depending on Variations in Film Thickness of Phosphor Layer/Average Particle Size Using Al+Ag Substrate)

(2-1) Sample Fabrication Method

A paste prepared by mixing ethyl silicate and terpineol with YAG-based phosphor particles (average particle size 18 μm) was applied to Al+Ag sheets as substrates by a screen printing method so that the film thickness would be 30, 40, 60, 100 and 180 μm. Sample wavelength converting members were thus obtained. The Al+Ag substrates were mainly composed of an Al alloy and an Ag film (MIRO2 SILVER manufactured by Alanod was used).

(2-2) Evaluation Method

The wavelength converting members obtained by the above method of the fabrication of wavelength converting members were irradiated with laser light using the reflection-type evaluation system to examine the fluorescent emission intensity and the emission efficiency retention ratio at various laser power densities.

(2-3) Evaluation Results

Figure 5:
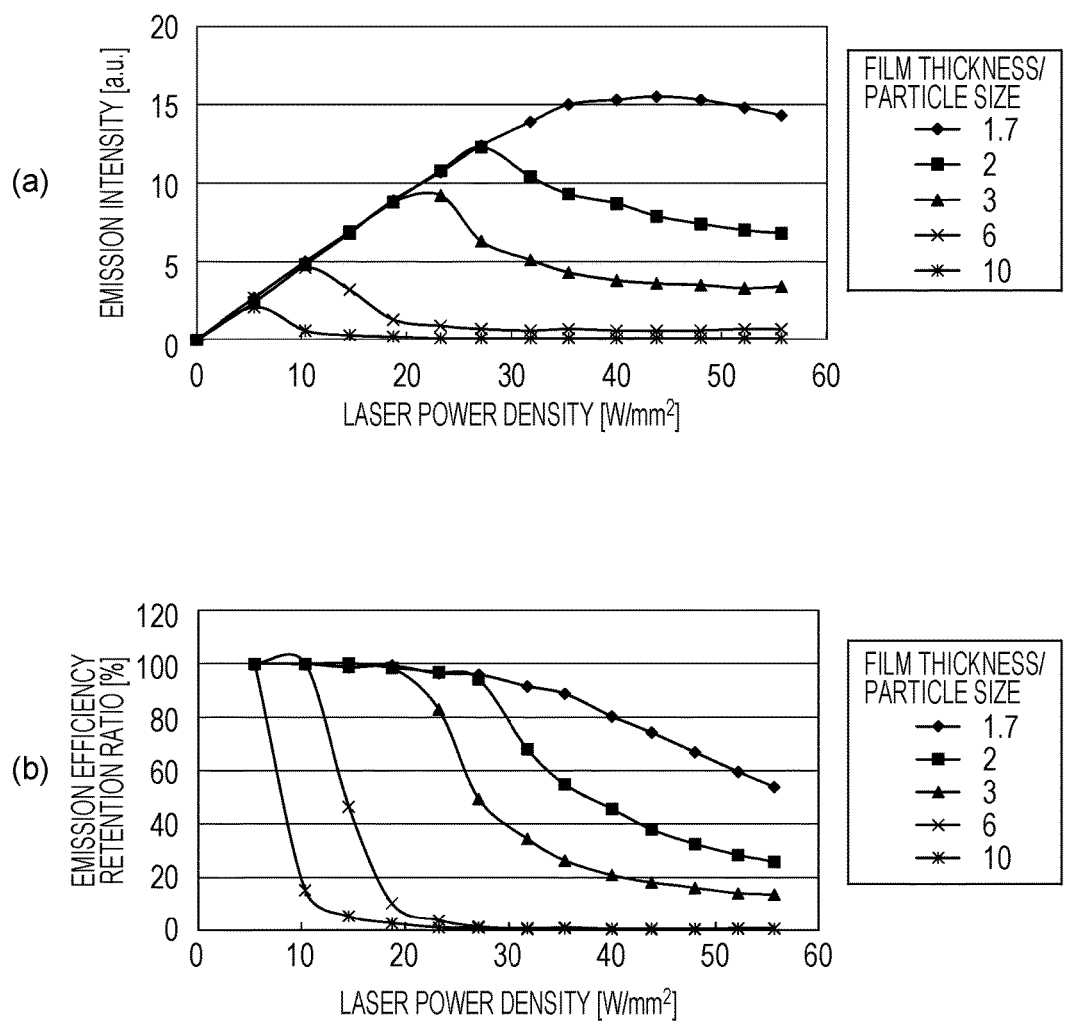
FIGS. 5(a) and 5(b) are each a graph illustrating emission characteristics obtained while changing the thickness of a phosphor layer relative to a constant phosphor particle size.

By the above evaluation, the emission characteristics of the phosphor layers were obtained. FIGS. 5(a) and 5(b) are each a graph illustrating the emission characteristics obtained while changing the thickness of the phosphor layer relative to the constant phosphor particle size as described in the table below. The graphs show the fluorescent emission intensity and the emission efficiency retention ratio at various laser power densities under the respective conditions.

TABLE 2

| Film thickness/Particle size [—] | Average particle size [μm] | Film thickness [μm] |
|---|---|---|
| 1.7 | 18 | 30 |
| 2 | | 40 |
| 3 | | 60 |
| 6 | | 100 |
| 10 | | 180 |

It has been shown that with all ratios of the film thickness of the phosphor layer to the average particle size of the phosphor particles, the fluorescent emission intensity increases with increasing laser input. It has been also shown that until a saturation point is reached, the fluorescent emission intensity is substantially the same irrespective of the phosphor layer thickness/average particle size ratio, and the emission efficiency retention ratio can stay at a high level as the ratio of the phosphor layer thickness to the average particle size is smaller. Regarding the emission efficiency retention, a smaller ratio of the film thickness of the phosphor layer to the average particle size of the phosphor particles is probably more effective for the prevention of heat storage because the number of contacts among the particles is small.

It has been shown that by lowering the ratio of the film thickness of the phosphor layer to the average particle size of the phosphor particles, the storage of heat in the phosphor layer is reduced and, in Al+Ag substrates, the luminance (emission efficiency) retention ratio is increased.

(3. Examination of Fluorescent Luminance (Emission Intensity) and Luminance (Emission Efficiency) Retention Ratio at Various Film Thickness/Average Particle Size Ratios)

(3-1) Sample Fabrication Method

A paste prepared by mixing ethyl silicate and terpineol with YAG-based phosphor particles was applied to aluminum sheets (reflection-type type) as substrates by a screen printing method.

(3-2) Evaluation Method

The wavelength converting members obtained by the above method of the fabrication of wavelength converting members were irradiated with laser light using the reflection-type evaluation system 800 to examine the emission efficiency retention ratio at a laser power density of 20 W/mm$^2$.

A phosphor generates more heat with increasing value of laser power density. When the temperature of the phosphor layer increases, the phosphor is quenched and the emission efficiency is decreased. The influence of heat generated by increasing the laser power density was calculated from the slope of a graph at low laser power densities where the influence of heat generation was negligible (the slope of a proportional relationship). The ideal value with negligible thermal influence (the value determined from the proportional relationship) was taken as 100%. The luminance (emission efficiency) retention ratio was defined as the value obtained by subtracting the proportion of luminance (emission intensity) decreased due to actual influence of heat from 100%. The samples were accepted when the luminance (emission efficiency) retention ratio was 70% or above, and were rejected when the ratio was below 70%.

In YAG phosphors and nitride phosphors that are generally said to have high heat resistance, the phosphor temperature when the luminance (emission intensity) has fallen to 70% is estimated to be about 300° C. Even these phosphors generally considered to have high heat resistance gradually start to lower their performance when they are heated to 300° C. and above in the air. From the points of view of the safety of illumination devices and the life of the phosphor, it will be therefore appropriate that the luminance (emission efficiency) retention ratio under influence of heat be 70% or above. Thus, 70% was adopted as the criterion between acceptance and rejection of the luminance (emission efficiency) retention ratio.

(3-3) Evaluation Results

The conditions and the results are described in the table below.

TABLE 3

| | Phosphor | Average particle size [μm] | Film thickness [μm] | Film thickness/ Particle size [—] | Emission efficiency retention ratio [%] |
|---|---|---|---|---|---|
| Ex. | YAG | 0.6 | 4 | 6.7 | 100.1 |
| Ex. | YAG | 0.6 | 8 | 13.3 | 99.8 |
| Comp. Ex. | YAG | 0.6 | 20 | 33.3 | 30.5 |
| Ex. | YAG | 0.9 | 2 | 2.2 | 99.8 |

TABLE 3-continued

| | Phosphor | Average particle size [μm] | Film thickness [μm] | Film thickness/ Particle size [—] | Emission efficiency retention ratio [%] |
|---|---|---|---|---|---|
| Ex. | YAG | 0.9 | 3 | 3.3 | 90.7 |
| Ex. | YAG | 0.9 | 10 | 11.1 | 89.0 |
| Ex. | YAG | 0.9 | 15 | 16.7 | 80.2 |
| Ex. | YAG | 0.9 | 20 | 22.2 | 75.3 |
| Comp. Ex. | YAG | 0.9 | 30 | 33.3 | 25.4 |
| Ex. | YAG | 3 | 8 | 2.7 | 100.3 |
| Ex. | YAG | 3 | 12 | 4.0 | 98.6 |
| Ex. | YAG | 3 | 20 | 6.7 | 86.4 |
| Ex. | YAG | 3 | 40 | 13.3 | 75.3 |
| Comp. Ex. | YAG | 3 | 60 | 20.0 | 18.0 |
| Ex. | YAG | 6 | 10 | 1.7 | 100.1 |
| Ex. | YAG | 6 | 20 | 3.3 | 98.0 |
| Ex. | YAG | 6 | 30 | 5.0 | 89.5 |
| Ex. | YAG | 6 | 40 | 6.7 | 78.1 |
| Comp. Ex. | YAG | 6 | 60 | 10.0 | 20.8 |
| Comp. Ex. | YAG | 6 | 80 | 13.3 | 16.5 |
| Ex. | YAG | 9 | 15 | 1.7 | 99.9 |
| Ex. | YAG | 9 | 20 | 2.2 | 85.6 |
| Ex. | YAG | 9 | 40 | 4.4 | 74.8 |
| Ex. | YAG | 9 | 80 | 8.9 | 71.5 |
| Comp. Ex. | YAG | 9 | 100 | 11.1 | 22.5 |
| Ex. | YAG | 13 | 15 | 1.2 | 100.1 |
| Ex. | YAG | 13 | 20 | 1.5 | 99.8 |
| Ex. | YAG | 13 | 30 | 2.3 | 99.5 |
| Ex. | YAG | 13 | 40 | 3.1 | 94.4 |
| Ex. | YAG | 13 | 60 | 4.6 | 79.8 |
| Comp. Ex. | YAG | 13 | 80 | 6.2 | 25.0 |
| Comp. Ex. | YAG | 13 | 100 | 7.7 | 22.6 |
| Comp. Ex. | YAG | 13 | 150 | 11.5 | 14.1 |
| Ex. | YAG | 18 | 20 | 1.1 | 99.7 |
| Ex. | YAG | 18 | 30 | 1.7 | 99.3 |
| Ex. | YAG | 18 | 40 | 2.2 | 98.5 |
| Ex. | YAG | 18 | 60 | 3.3 | 98.5 |
| Ex. | YAG | 18 | 80 | 4.4 | 71.2 |
| Comp. Ex. | YAG | 18 | 100 | 5.6 | 10.3 |
| Comp. Ex. | YAG | 18 | 120 | 6.7 | 9.6 |
| Comp. Ex. | YAG | 18 | 150 | 8.3 | 8.6 |
| Comp. Ex. | YAG | 18 | 180 | 10.0 | 2.8 |
| Ex. | YAG | 62 | 80 | 1.3 | 99.7 |
| Ex. | YAG | 62 | 100 | 1.6 | 99.5 |
| Ex. | YAG | 62 | 200 | 3.2 | 98.5 |
| Ex. | YAG | 62 | 300 | 4.8 | 78.4 |
| Comp. Ex. | YAG | 62 | 400 | 6.5 | 25.2 |
| Ex. | YAG | 85 | 150 | 1.8 | 100.3 |
| Ex. | YAG | 85 | 200 | 2.4 | 99.8 |
| Ex. | YAG | 85 | 400 | 4.7 | 80.1 |
| Comp. Ex. | YAG | 85 | 450 | 5.3 | 23.1 |

The reflection-type wavelength converting members have been found to meet the evaluation criterion when the average particle size of the phosphor particles and the ratio of the thickness of the phosphor layer to the average particle size of the phosphor particles are in the ranges described in Table 1.

(4. Differences Depending on Types of Phosphor Particles)

(4-1) Sample Fabrication Method

A paste prepared by mixing ethyl silicate and terpineol with YAG-based phosphor particles was applied to aluminum sheets as substrates by a screen printing method so that the film thickness would be 30 μm. Three types of phosphor particles with average particle sizes of 6, 13 and 18 μm were used.

(4-2) Evaluation Method

The wavelength converting members with the aluminum substrate obtained by the above method of the fabrication of wavelength converting members were irradiated with laser light using the reflection-type evaluation system 800 to examine the fluorescent emission intensity and the emission efficiency retention ratio at various laser power densities.

(4-3) Evaluation Results

Figure 6:
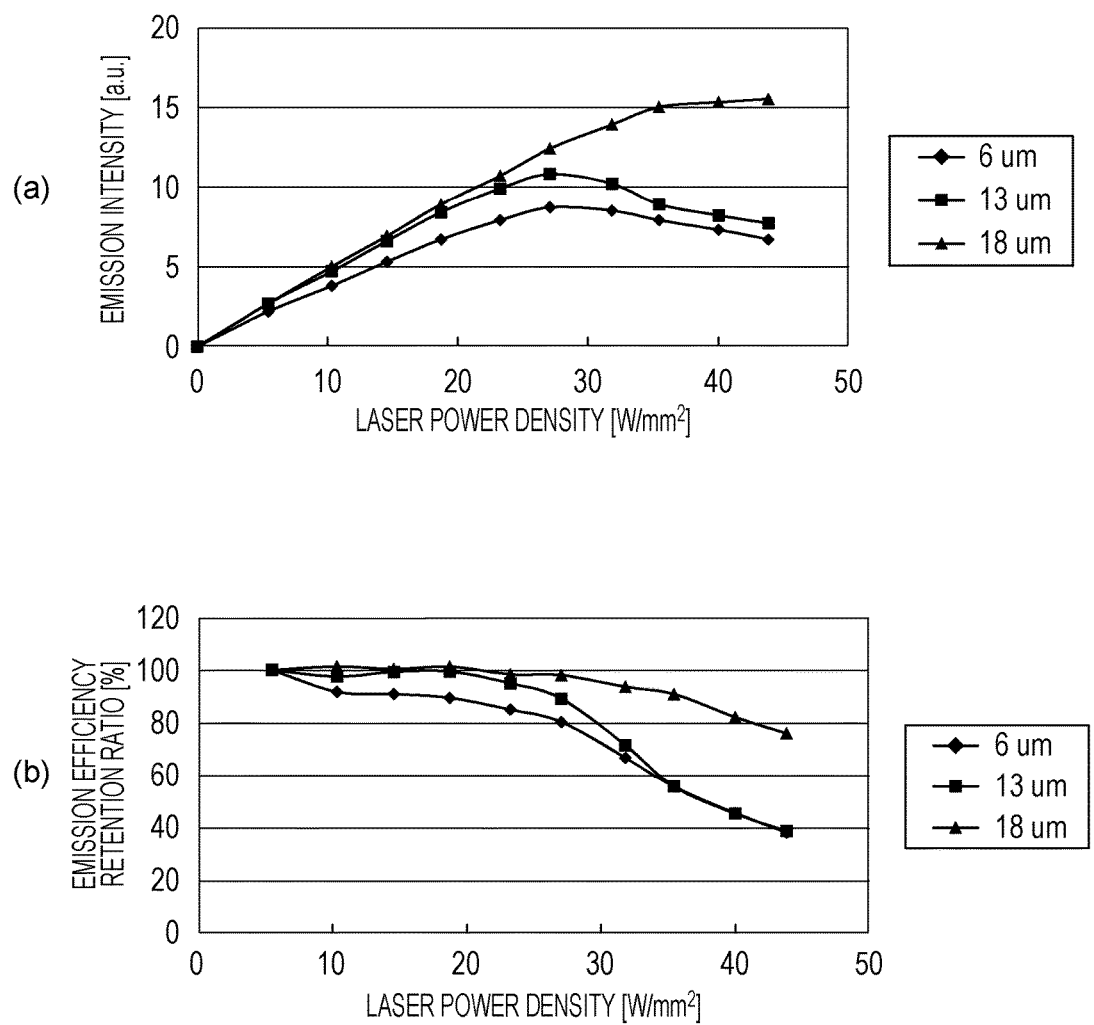
FIGS. 6(a) and 6(b) are each a graph illustrating emission characteristics obtained while changing the average particle size of phosphor particles.

FIGS. 6(a) and 6(b) are each a graph illustrating the emission characteristics obtained while changing the average particle size of the phosphor particles. As illustrated in FIGS. 6(a) and 6(b), it has been shown that the fluorescent emission intensity and the emission efficiency retention ratio are higher with increasing average particle size of the phosphor particles. The reasons for this are probably because the conversion efficiency is higher with increasing size of the phosphor particles and also because larger phosphor particles have less contacts among phosphor particles and consequently thermal storage is prevented.

(5. Porosity)

(5-1) Sample Fabrication Method

A paste prepared by mixing ethyl silicate and terpineol with YAG-based phosphor particles (average particle size 18 μm) was applied to aluminum sheets as substrates by a screen printing method so that the film thickness would be 30 μm. Sample wavelength converting members were thus obtained.

(5-2) Evaluation Method

The wavelength converting members obtained were analyzed to calculate the porosity and were subjected to laser irradiation test, and relationships were examined between the porosity and the fluorescent emission intensity and between the porosity and the saturation point. For the calculation, the porosity was defined to be the proportion of the volume of pores in the phosphor film relative to the apparent volume obtained by connecting the outermost surfaces of the phosphor particles on the phosphor film with straight lines. The volume of the pores was calculated by subtracting the volume of solid components from the apparent volume.

(5-3) Evaluation Results

Figure 7:
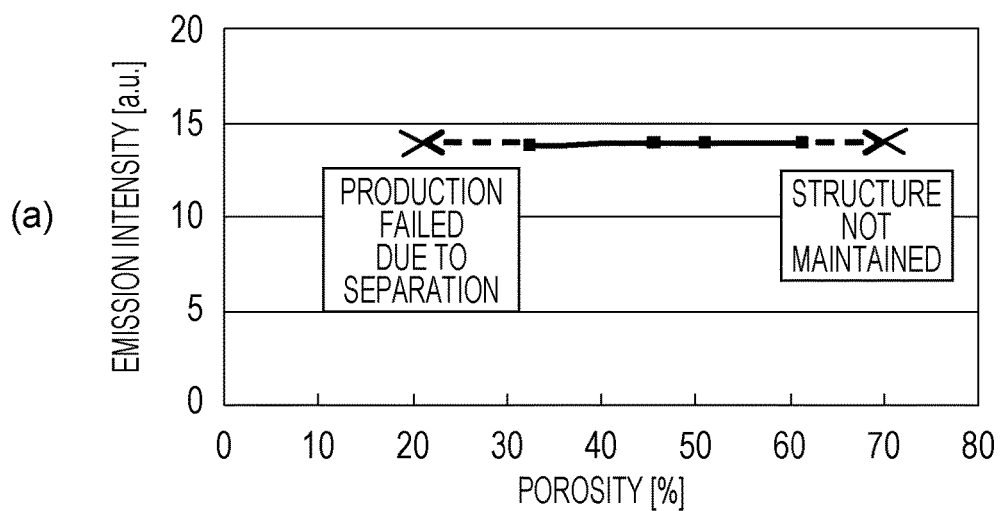
FIGS. 7(a) and 7(b) are graphs illustrating a relationship between porosity and fluorescent emission intensity and a relationship between porosity and saturation point, respectively.
Figure 7:
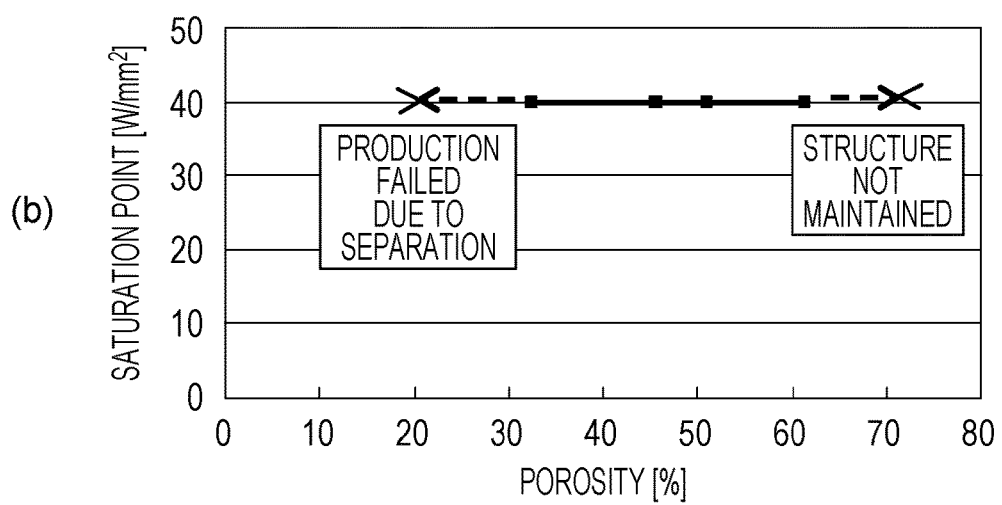

FIGS. 7(a) and 7(b) are graphs illustrating a relationship between the porosity and the fluorescent emission intensity and a relationship between the porosity and the saturation point, respectively. From the relationships of the porosity with the fluorescent emission intensity and the saturation point illustrated in FIGS. 7(a) and 7(b), it has been shown that the fluorescent emission intensity and the saturation point are stable in the range of porosity of 30 to 70%. At a porosity of less than 30%, separation occurs due to the heat treatment during fabrication, and the production of wavelength converting members is difficult. The cause of this separation is probably the difference in thermal expansion between the substrate and the phosphor layer. At a porosity of 70% or above, the phosphor layer hardly maintains its structure and the production is difficult.

(6. Comparison with Sintered Bodies)

(6-1) Evaluation Method

A wavelength converting member (film thickness 30 μm) of the present invention obtained by the aforementioned method of fabrication of wavelength converting members, and a phosphor plate of a sintered body (a square plate 20.0 mm on a side and 1.0 mm in thickness) were irradiated with laser light using the reflection-type evaluation system 800 to examine the fluorescent emission intensity at various laser power densities and to examine the changes in fluorescent emission intensity depending on the porosity.

For the calculation, the porosity was defined to be the proportion of the volume of pores in the phosphor film relative to the apparent volume obtained by connecting the outermost surfaces of the phosphor particles on the phosphor film with straight lines. The volume of the pores was calculated by subtracting the volume of solid components from the apparent volume. The porosity of the wavelength converting member was 40%, and the porosity of the sintered body was less than 1%.

(6-2) Evaluation Results

Figure 8:
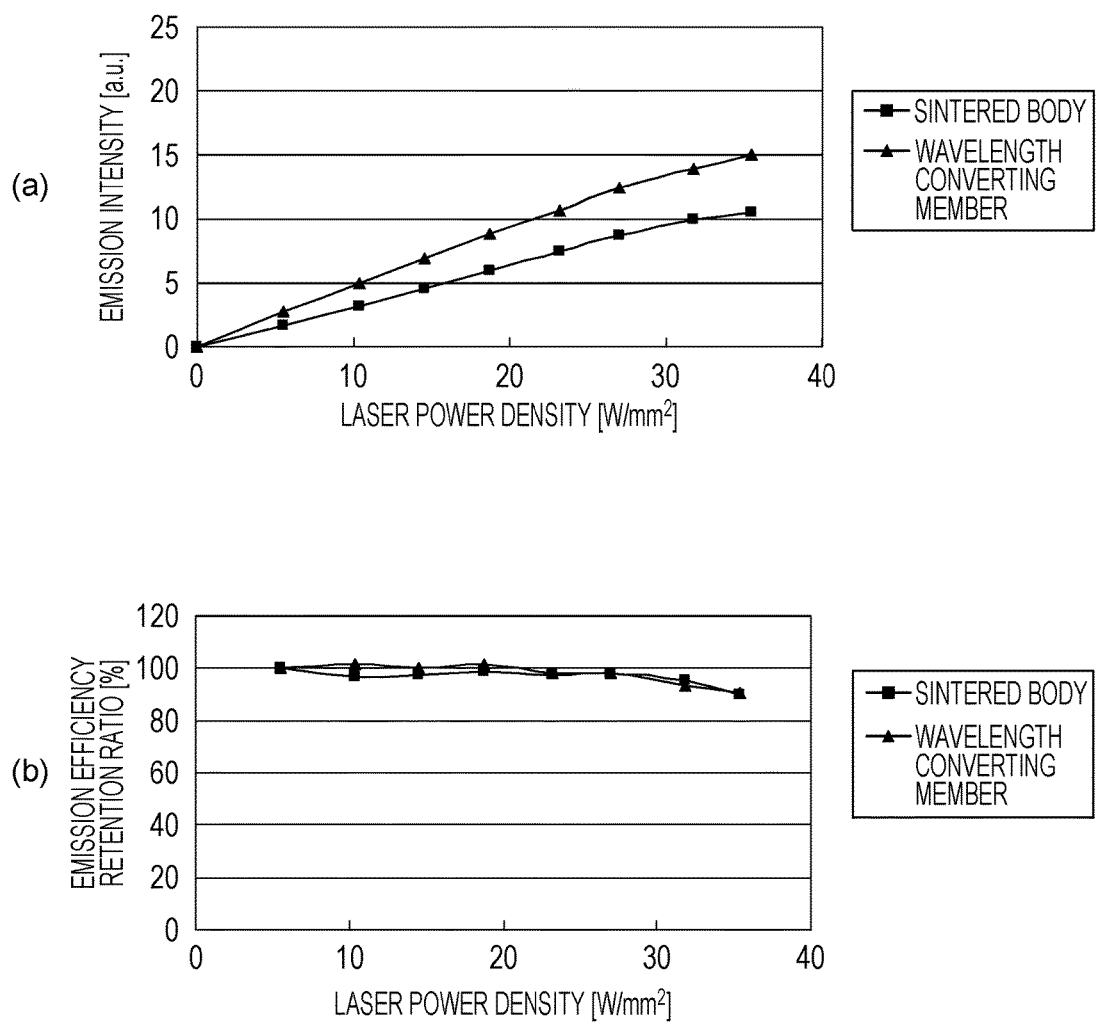
FIGS. 8(a) and 8(b) are each a graph illustrating emission characteristics of a sintered body and a wavelength converting member.

FIGS. 8(a) and 8(b) are each a graph illustrating the emission characteristics of the sintered body and the wavelength converting member. FIGS. 8(a) and 8(b) have shown that the wavelength converting member has higher fluorescent emission intensity. The reason for this is probably because the light was scattered by the pores in the layer of the wavelength converting member and the phosphor was allowed to convert the light efficiently and attained an increased fluorescent emission intensity. On the other hand, the sintered body with less pores is dense and thus it is probable that the laser light is scarcely scattered within the sintered body and simply passes therethrough.

While the sintered body with a low porosity allowed laser light to pass therethrough in spite of the thickness being 1 mm (1000 μm), the wavelength converting member of the present invention that was as thin as 30 μm scattered the light and emitted fluorescent light with high efficiency by virtue of the presence of appropriate pores. High effectiveness can be thus expected.

REFERENCE SIGNS LIST

10 LIGHT-EMITTING DEVICE
50 LIGHT SOURCE
100 WAVELENGTH CONVERTING MEMBER
110 SUBSTRATE
120 PHOSPHOR LAYER
121 TRANSLUCENT CERAMIC
122 PHOSPHOR PARTICLES
410 PASTE
510 INK SQUEEGEE
520 SILK SCREEN
600 FURNACE
700, 800 EVALUATION SYSTEMS
710 LIGHT SOURCE
720 PLANE-CONVEX LENS
730 DOUBLE-CONVEX LENS
735 BAND-PASS FILTER
740 POWER METER

What is claimed is:

1. A wavelength converting member of reflection type configured to convert light with a specific wavelength to light with other wavelength and also configured to reflect the light on a reflection surface, thereby emitting the light as illumination light, wherein
the wavelength converting member comprises:
a substrate including an inorganic material, and
a phosphor layer disposed on the substrate and including phosphor particles that absorb light and emit converted light and a translucent ceramic that binds the phosphor particles to one another;
the ratio of the thickness of the phosphor layer to the average particle size of the phosphor particles is less than 30;
when the wavelength converting member is irradiated with source light having a specific wavelength at a power density of 20 W/mm$^2$, the emission efficiency retention ratio of the phosphor layer is not less than 70%; and
the reflection surface on which the converted light is reflected is a surface of the substrate or a surface of a reflector adjacent to the wavelength converting member.

2. The wavelength converting member according to claim 1, which satisfies the following conditions:
(a) when the average particle size of the phosphor particles is less than 1 μm, the ratio of the thickness of the phosphor layer to the average particle size of the phosphor particles is less than 30;
(b) when the average particle size of the phosphor particles is not less than 1 μm and less than 5 μm, the ratio of the thickness of the phosphor layer to the average particle size of the phosphor particles is less than 15;
(c) when the average particle size of the phosphor particles is not less than 5 μm and less than 10 μm, the ratio of the thickness of the phosphor layer to the average particle size of the phosphor particles is less than 10; and
(d) when the average particle size of the phosphor particles is not less than 10 μm, the ratio of the thickness of the phosphor layer to the average particle size of the phosphor particles is less than 5.

3. The wavelength converting member according to claim 1, wherein the porosity of the phosphor layer is 30 to 70%, the porosity being the proportion of the volume of pores calculated by subtracting the volume of solid components present in an apparent volume from the apparent volume wherein the apparent volume is the volume of a layer with a constant thickness defined between planes of the phosphor layer in contact with the outermost surface of the phosphor particles and with the substrate.

4. The wavelength converting member according to claim 1, wherein the substrate comprises aluminum.

5. A light-emitting device comprising:
a light source which generates source light having a specific wavelength; and
the wavelength converting member described in claim 1 which absorbs the source light and emits light with other wavelength converted from the source light.

6. A wavelength converting member of reflection type configured to convert light with a specific wavelength to light with other wavelength and also configured to reflect the light on a reflection surface, thereby emitting the light as illumination light, wherein
the wavelength converting member comprises:
a substrate including an inorganic material, and
a phosphor layer disposed on the substrate and including phosphor particles that absorb light and emit converted light and a translucent ceramic that binds the phosphor particles to one another;
the ratio of the thickness of the phosphor layer to the average particle size of the phosphor particles is less than 30;
when the wavelength converting member is irradiated with source light having a specific wavelength at a power density of 20 W/mm$^2$, the emission efficiency retention ratio of the phosphor layer is not less than 70%;
the reflection surface on which the converted light is reflected is a surface of the substrate or a surface of a reflector adjacent to the wavelength converting member;
wherein the wavelength converting member satisfies the following conditions:
(a) when the average particle size of the phosphor particles is less than 1 μm, the ratio of the thickness of the phosphor layer to the average particle size of the phosphor particles is less than 30;
(b) when the average particle size of the phosphor particles is not less than 1 μm and less than 5 μm, the ratio of the thickness of the phosphor layer to the average particle size of the phosphor particles is less than 15;
(c) when the average particle size of the phosphor particles is not less than 5 μm and less than 10 μm, the ratio of the thickness of the phosphor layer to the average particle size of the phosphor particles is less than 10; and
(d) when the average particle size of the phosphor particles is not less than 10 μm, the ratio of the thickness of the phosphor layer to the average particle size of the phosphor particles is less than 5; and
wherein the porosity of the phosphor layer is 30 to 70%, the porosity being the proportion of the volume of pores calculated by subtracting the volume of solid components present in an apparent volume from the apparent volume wherein the apparent volume is the volume of a layer with a constant thickness defined between planes of the phosphor layer in contact with the outermost surface of the phosphor particles and with the substrate.

7. The wavelength converting member according to claim 6, wherein the substrate comprises aluminum.

8. A light-emitting device comprising:
a light source which generates source light having a specific wavelength; and
the wavelength converting member described in claim 6 which absorbs the source light and emits light with other wavelength converted from the source light.

* * * * *